United States Patent [19]
Miyoshi

[11] Patent Number: 5,838,546
[45] Date of Patent: Nov. 17, 1998

[54] MOUNTING STRUCTURE FOR A SEMICONDUCTOR CIRCUIT

[75] Inventor: Tadayoshi Miyoshi, Tokyo, Japan

[73] Assignee: NEC Corporation, Tokyo, Japan

[21] Appl. No.: 834,163

[22] Filed: Apr. 14, 1997

[30] Foreign Application Priority Data

Apr. 12, 1996 [JP] Japan ..................................... 8-115818

[51] Int. Cl.⁶ ................................................. H05K 01/16
[52] U.S. Cl. ........................ 361/749; 361/813; 174/268; 174/254; 257/735; 257/776
[58] Field of Search .................... 361/749, 813; 174/268, 254; 257/735, 776

[56] References Cited

U.S. PATENT DOCUMENTS

| | | | |
|---|---|---|---|
| 5,206,463 | 4/1993 | DeMaso et al. | 174/254 |
| 5,262,594 | 11/1993 | Edwin et al. | 174/254 |
| 5,276,590 | 1/1994 | Budman et al. | 361/796 |
| 5,527,998 | 6/1996 | Anderson et al. | 174/255 |
| 5,616,888 | 4/1997 | McLaughlin et al. | 174/260 |

*Primary Examiner*—Leo P. Picard
*Assistant Examiner*—David Foster
*Attorney, Agent, or Firm*—Sughrue, Mion, Zinn, Macpeak & Seas, PLLC

[57] ABSTRACT

In a tape carrier package applying a TAB technique, a flex rigid PWB is used as a tape carrier. A flexible portion is provided with a semiconductor connection terminal. An LSI is directly mounted to the flexible portion. A rigid portion is provided with an electrode for mounting a component and an electrode for an external input/output.

7 Claims, 11 Drawing Sheets

25 CONDUCTIVE PIN

FIG.3A

25 ELECTRODE

FIG.3B

25 METALLIE BUMP

MOUNTING STRUCTURE FOR A SEMICONDUCTOR CIRCUIT

BACKGROUND OF THE INVENTION

The present invention relates to a mounting structure for a semiconductor. More specifically, the present invention relates to a high-speed processing and a high-density mounting system.

This kind of mounting structure is referred to, for example, a publication ("Introduction to TAB technique", pages 286 to 289, 12.3 a hearing aid, FIG. 12.7, a cross section of a constitution of a module for the hearing aid, published on Jan. 25, 1990, written by Kenzo Hamada), etc.

Heretofore, according to the mounting structure of an LSI, the LSI has been mounted one by one to a chip carrier, and the chip carrier has been mounted to a mounting substrate.

Figure 10:
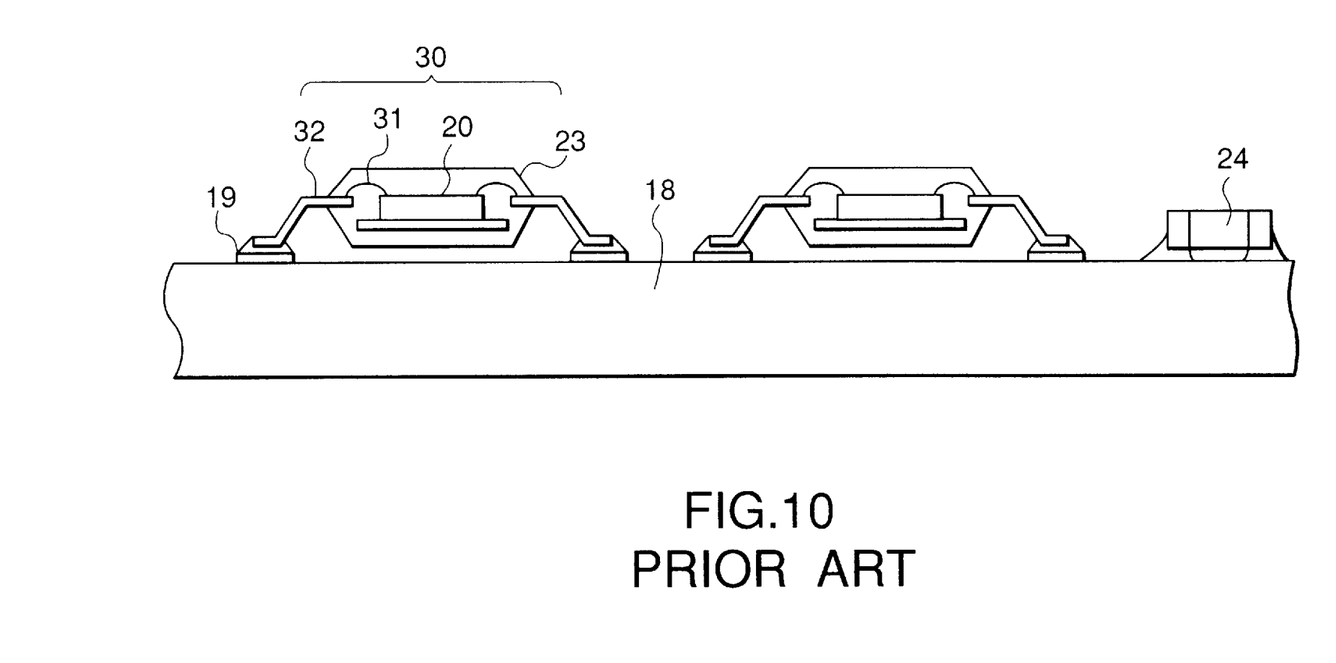
FIG. 10 shows the prior art.

A conventional structure will be described with reference to FIG. 10. An LSI 20 (IC) is electrically connected to a lead frame 32 by a bonding wire 31, a TAB, etc. (by using ILB:inner lead bonding). The LSI is sealed by a protective resin 23. This is called "a mold package"

An outer lead of the lead frame 32 of this mold package is soldered to a pad 19 of the mounting substrate, and the mold package is mounted to the mounting substrate.

In an ILB (inner lead bonding) technique, a Tab connection is used as not only a connection technique, but also as a TCP package (tape carrier package) in which a TAB tape is used as the chip carrier.

Furthermore, a plurality of LSIs are mounted to the tape carrier, and, in some cases, the tape carrier is used as an MCM (multi-chip module).

Furthermore, the TCP is advanced, and there could be an application wherein another electronic component is mounted on the tape carrier and one module is formed, etc.

Figure 11:
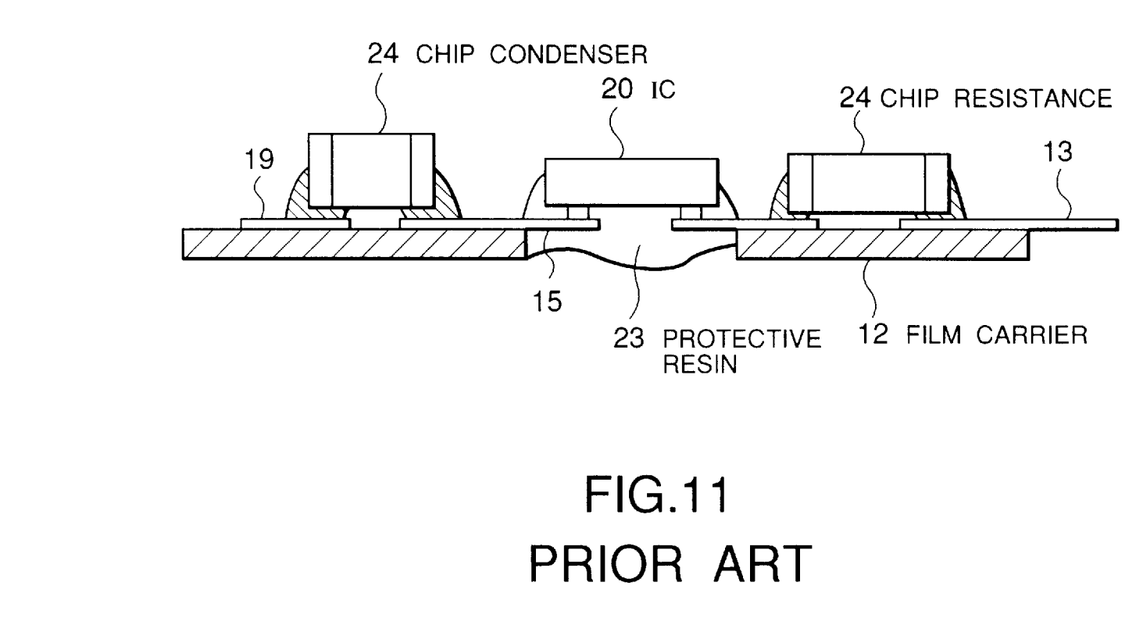
FIG. 11 shows another prior art device.

As described in the above publication ("Introduction to TAB technique", page 287, FIG. 12.7), as the hearing aid used as the module using the TAB technique, the constitution example of the same is shown in FIG. 11.

Referring to FIG. 11, a wiring pattern 13 is arranged on a film carrier 12. An inner lead 15 integrated with the wiring pattern is arranged in a device hole (a hole arranged to the film carrier for mounting the IC). The inner lead 15 is mounted to the IC 20 by ILB. Thereafter, the IC 20 and the inner lead 15 are sealed by a protective resin 23. Furthermore, an electrode 19 for mounting the component is arranged on the film carrier 12. A chip capacitor and a chip resistance 24 are soldered to the electrode 19.

Since the MCM using a ceramic substrate is advantageous for a high density of the wiring and a large scaling, the MCM using a ceramic substrate is generally used.

According to the conventional mounting structure, the LSI is mounted one by one on the chip carrier. When the chip carrier is mounted on the mounting substrate, since a dimension of the chip carrier is larger than the LSI, the chip carrier is not suitable for a reduced size.

Furthermore, there are some connection portions such as a connection of a bonding pad of the LSI and a bonding wire, the connection of the bonding wire and the lead frame and the connection of the lead frame and the electrode of the mounting substrate at a signal transmission path. The reduction in reliability is mainly caused by these connection portions. That is, due to the connection portions, the yield is deteriorated, and longevity is reduced. Thus, it is better that there are less connection portions.

Furthermore, according to the conventional mounting structure, a problem exists wherein the signal transmission path is lengthened.

Recently, as an inner processing rate of the LSI is carried out at high speed, an outer portion of the LSI, that is, the wiring of the chip carrier and the substrate has a great influence upon a signal delay. Thus, it is required to reduce the signal delay at the outer portion of the LSI in order to realize the high speed processing all over the module.

More specifically, when a plurality of LSIs are mounted to the substrate, a wire length becomes longer, whereby there is a serious problem that a delay time of a signal transmission between the LSIs occurs. That is, a speeding-up of an operation processing rate suffers from the delay time.

The MCM and module using the tape carrier appears to solve the problem. However, according to the conventional tape carrier, it is difficult to realize a multi-layer and to increase a wiring density. Thus, the wiring between the LSIs is limited to a simple wiring, whereby it is difficult to form a high-density module.

Furthermore, since the tape carrier has a flexibility, the LSI has many pins. The tape carrier is changed to the MCM, so that the tape carrier becomes larger. In this case, when the tape carrier is mounted to the substrate, the TCP is curved. Accordingly, it is difficult to carry out a general reflow, whereby the tape carrier is not suitable for a mass production.

Furthermore, as described by the prior art, the chip resistance and the chip capacitor can be mounted to the chip carrier. However, since the tape carrier has more flexibility than the substrate having a rigidity, the tape carrier is not suitable for mounting the chip resistance and the chip capacitor. Accordingly, the tape carrier is disadvantageous to the large scaling.

On one hand, the MCM using a ceramic substrate is more expensive than the tape carrier. Furthermore, compared to the case of using the tape carrier, since a connection terminal for the LSI cannot be directly mounted, the connection portion is increased. That is, the reliability is reduced.

Accordingly, the present invention is made in view of the problems. It is an object of the present invention to provide the mounting structure for the LSI using the tape carrier which is preferable for the high density for a small size, the large scaling and the high speed, and to provide a low-cost MCM.

SUMMARY OF THE INVENTION

In order to achieve the object, according to one aspect of the present invention, there is provided a semiconductor mounting structure comprising a flex rigid substrate, wherein a flex portion is provided with a connection terminal for a semiconductor integrated circuit, the semiconductor integrated circuit being directly connected and mounted to the connection terminal for the semiconductor integrated circuit.

According to another aspect of the present invention, there is provided a semiconductor mounting structure, wherein the semiconductor integrated circuit is sealed by a resin after mounting the semiconductor integrated circuit.

According to a further aspect of the present invention, there is provided a semiconductor mounting structure, wherein a rigid portion of the flex rigid substrate is provided with an electrode for mounting an electronic component, and the electronic component is mounted to the connection terminal for mounting the electronic component.

According to a further aspect of the present invention, there is provided a semiconductor mounting structure, wherein a plurality of semiconductor integrated circuits are mounted to the flex portion.

DETAILED DESCRIPTION OF THE PREFERRED EMBODIMENTS

The embodiments of the present invention will be described with reference to the accompanying drawings. According to the embodiments of the present invention, a tape carrier using a flex rigid PWB is used. The flex rigid PWB (printed-wiring board) is a composite substrate in which a flexible PWB having a flexibility is electrically connected to and integrated with a rigid PWB for mounting a component via a through hole.

According to the embodiments of the present invention, a flex portion (having a numeral 11 in FIGS. 1 and 2) of the flex rigid substrate is provided with a connection terminal for a semiconductor (having a numeral 15 in FIG. 2) (inner lead similar to TAB). The flex portion is directly connected to an LSI (having a numeral 20 in FIG. 2), whereby the LSI is mounted to the substrate.

In a chip carrier used for the flex rigid PWB, since the LSI is directly connected to a flex portion (having a numeral 11 in FIG. 2), there is less connection portion, whereby a reliability is enhanced.

Furthermore, since the LSI is directly connected to the flex portion, a wire length becomes shorter and a signal transmission delay time is reduced. Thus, more specifically, when a plurality of LSIs are mounted to the chip carrier, a great effect can be obtained. That is, a plurality of LSIs are mounted to one chip carrier (see FIGS. 7 and 8), whereby an electrical distance between the LSIs is reduced. Accordingly, the signal transmission delay time is reduced, whereby the chip carrier is suitable for a high speed processing. Furthermore, simultaneously, a small size and a light weight can be realized.

Furthermore, according to the embodiments of the present invention, the chip carrier has a rigid portion (having a numeral 16 in FIG. 2), whereby a multi-layer can be easily realized and a complex high-density wiring can be realized.

Figure 2:
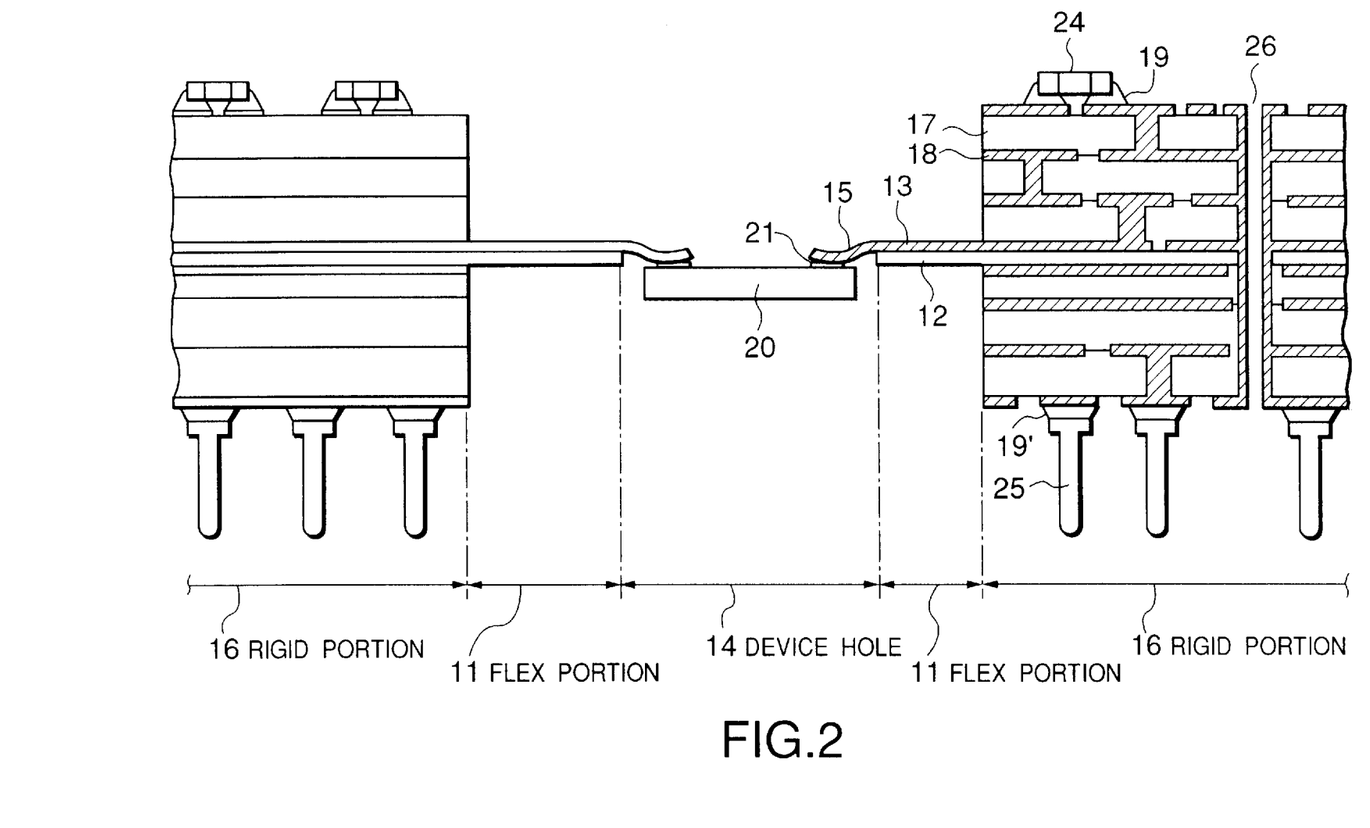
FIG. 2 shows a cross-sectional view taken on line 2—2 of FIG. 1.

An electrode for mounting the component is arranged to the rigid portion 16 having rigidity, whereby the electronic component such as a chip capacitor, a chip resistance, etc. can be easily mounted on the chip carrier. As a result, the large scaling and high density can be realized.

Furthermore, according to the embodiments of the present invention, the rigid portion having rigidity is provided. Accordingly, when the chip carrier is mounted to the mounting substrate, even if the chip carrier becomes larger, such a problem as a curvature is solved. Accordingly, soldering by using a general reflow can be carried out, and mass production can be made easy.

Since the PWB is more inexpensively available than a ceramic, the cost of the MCM is reduced.

An advantage of the present invention over a ceramic MCM will be described below. In the case of the MCM, in which a plurality of LSIs are mounted, in general, a ceramic substrate is used as a material of the chip carrier. In the case of the ceramic substrate, since the LSI is connected to the chip carrier, there are required two connections such as the connection of a bonding pad of the LSI and a bonding wire and the connection of the bonding wire and the electrode of the chip carrier.

On the contrary, according to the chip carrier of the present invention, the chip carrier can be connected to the LSI by only connecting the bonding pad of the LSI to the inner lead by the ILB. Thus, the reliability is enhanced, and further a signal transmission time between the LSIs is reduced. Accordingly, the chip carrier of the present invention is suitable for the high speed processing. Furthermore, since the PWB is more inexpensive and lighter than the ceramic substrate, the small-sized light MCM having a higher performance can be inexpensively provided.

The advantage of the present invention over the TCP will be described below. Although the MCM and module using the TCP is small-sized and light, the multi-layer is difficult to realize.

According to the present invention, since the rigid portion of the chip carrier is multi-layered, a complex and high-density wiring can be realized. Thus, in a combination of the LSIs, there can be such various combinations that a plurality of EPUs are combined to one another and the EPU is combined to a memory, etc.

According to the present invention, the chip carrier has the rigid portion having rigidity. Accordingly, a receiving component such as the chip capacitor, the chip resistance, etc. or, in some cases, a packaged LSI (of the memory, etc.) can be easily mounted to the LSI.

Next, the embodiments of the present invention will be described with reference to the accompanying drawings.

Embodiment 1

Figure 1:
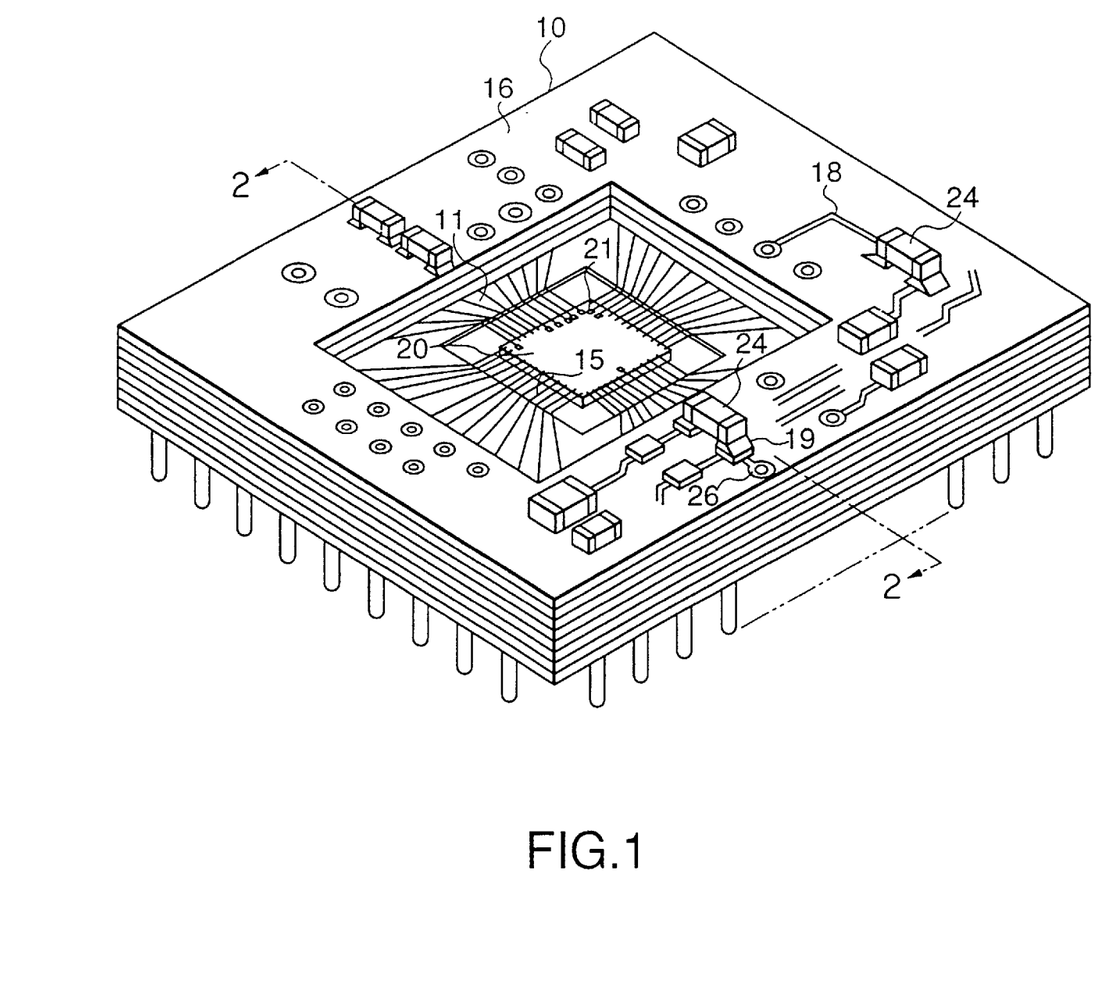
FIG. 1 shows a perspective view of a first embodiment of the present invention.

FIG. 1 shows an exploded perspective view of a first embodiment of the present invention. FIG. 2 shows a cross-sectional view taken on line a—a of FIG. 1.

Referring to FIG. 1, the mounting structure of the present invention uses the flex rigid substrate comprising the flex portion 11 having the flexibility and the rigid portion 16 having the rigidity which can be the multi-layer.

Referring to FIG. 2, the flex portion 11 comprises a polyimide film 12 having the flexibility and a conductive layer 13 comprising a copper.

A device hole 14 whose size is slightly larger than an outer shape of the LSI chip 20 is arranged to the polyimide film 12.

The portion protruded inside the device hole 14 of the conductive layer 13 comprising the copper is called an inner lead 15. The inner lead 15 is gilt.

The inner lead 15 is connected to a bonding pad 21 of the LSI 20 by the inner lead bonding (ILB), whereby the LSI 20 is electrically connected and further fixed to a wiring pattern (conductive layer pattern) 13. The LSI 20 is connected to the conductive layer 13 by only the ILB. That is, the first embodiment of the present invention is characterized by the fact that an outer lead bonding (OLB) is not necessary. Thus, the number of the components and manufacturing processes is reduced, whereby the cost can be reduced.

The rigid portion 16 is so formed that a glass epoxy 17 and a conductive layer (wiring pattern) 18 are alternately laminated to each other in such a manner that a film carrier comprising the polyimide film 12 and the conductive layer 13 is put therebetween. Each conductive layer 18 is connected to each other via a through hole 26.

Referring to FIGS. 1 and 2, an electrode 19 for soldering the electronic components is arranged on a front surface of the rigid portion 16. A receiving portion 24 such as the chip capacitor, the chip resistance, etc. is soldered and mounted to the electrode 19. Furthermore, in some cases, the receiving portion 24 is mounted to a rear surface of the rigid portion 16.

Figure 3A:
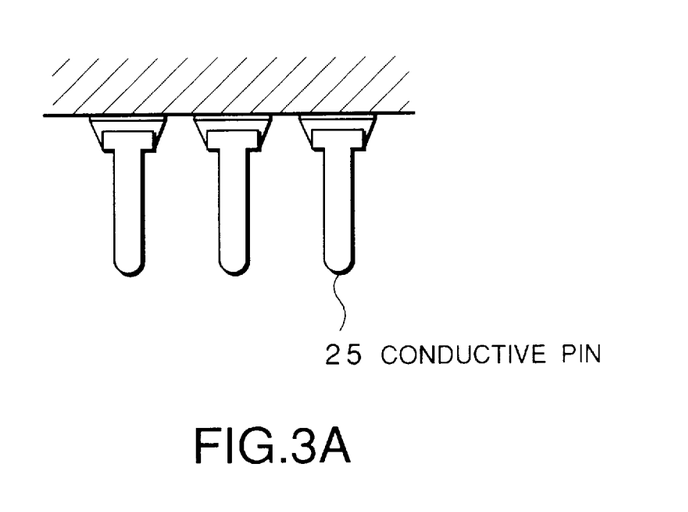
FIGS. 3A to 3C show another example of an external input/output terminal of the first embodiment of the present invention.

Furthermore, as shown in FIGS. 2 and 3(A), an electrode 19' to be connected to the mounting substrate is arranged to the rear surface of the rigid portion 16. As an external input/output terminal 25, a conductive pin is soldered to the rear surface of the rigid portion 16. The conductive pin 25 can be inserted into a socket. Furthermore, conductive pin 25 can be mounted by the through hole, a pad lead (front surface mounting), etc.

Figure 3B:
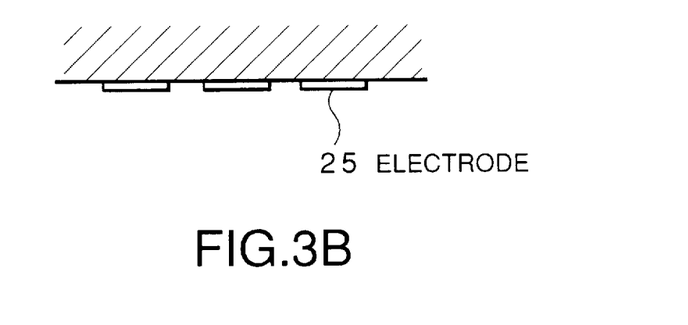
Figure 3C:
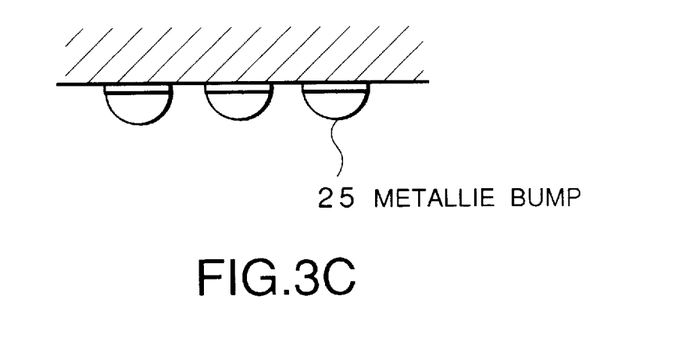
Figure 4:
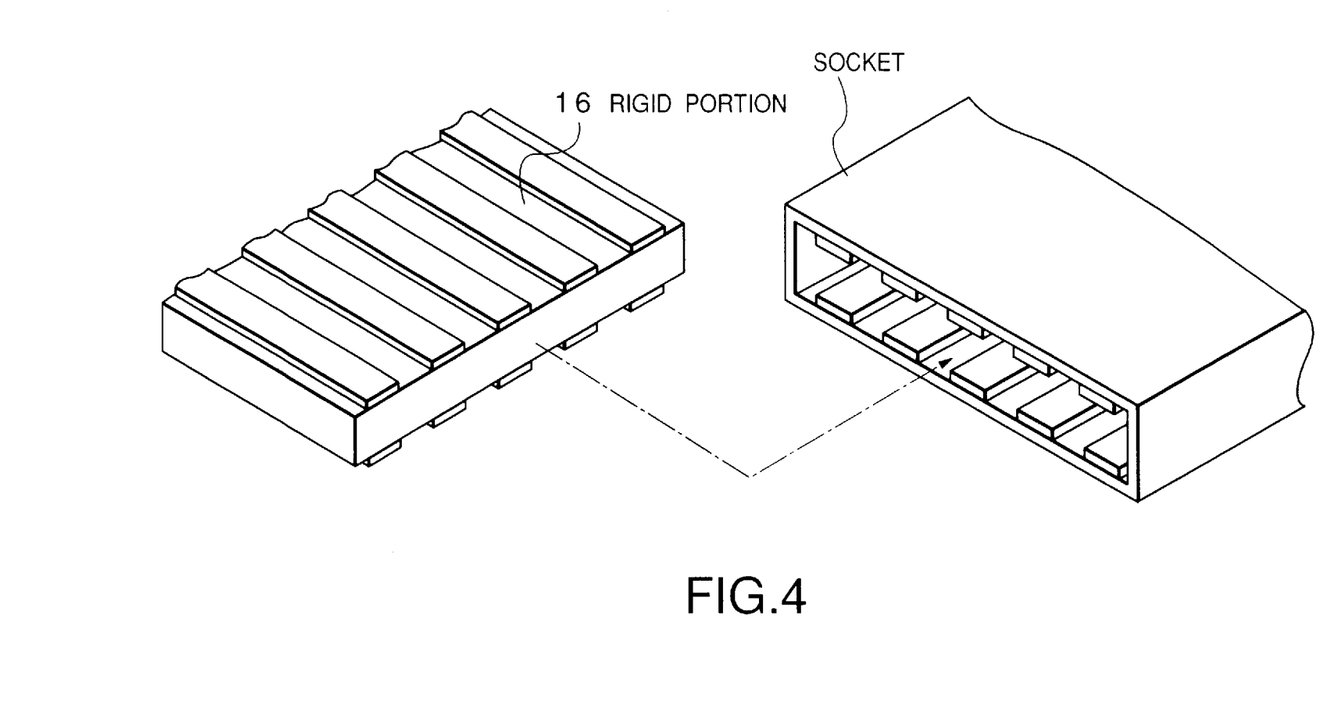
FIG. 4 shows still further example of the external input/output terminal of the first embodiment of the present invention.

In addition, for example, as shown in FIG. 3, the external input/output terminal 25 may have a structure of only the electrode (see FIG. 3(B)). The external input/output terminal 25 may have a structure of a metallic bump (see FIG. 3(C)). The external input/output terminal 25 may have such a structure that the rigid portion is inserted into the socket for connection (see FIG. 4). The external input/output terminal 25 may have such a structure that a connector is arranged to the rigid portion. The external input/output terminal 25 may have such a structure that the terminal is inserted into the through hole of the rigid portion for soldering. The external input/output terminal 25 may have such a structure that the flex portion is drawn out for connecting an energizing portion.

Figure 5A:
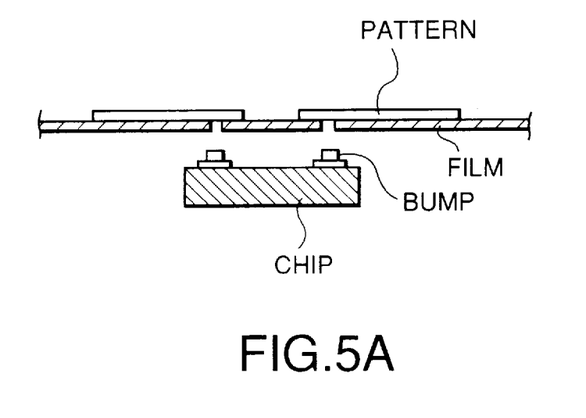
FIGS. 5A to 5B show another example of an ILB structure of the first embodiment of the present invention.
Figure 5B:
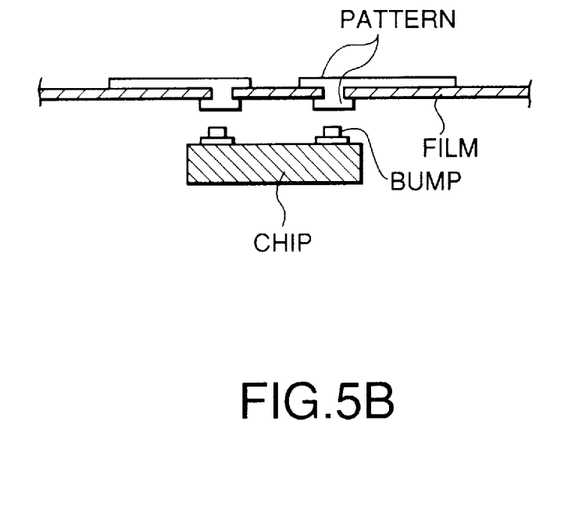

According to the structure of the ILB, as shown in FIG. 1, the LSI 20 is connected to the device hole by a face up inner lead bonding. In addition, the LSI 20 is connected to the device hole by a face down bonding. As shown in FIGS. 5(A) and 5(B), such a TAB method that the device hole is not arranged, a connection technique used for the TAB, etc. can be used.

Figure 6A:
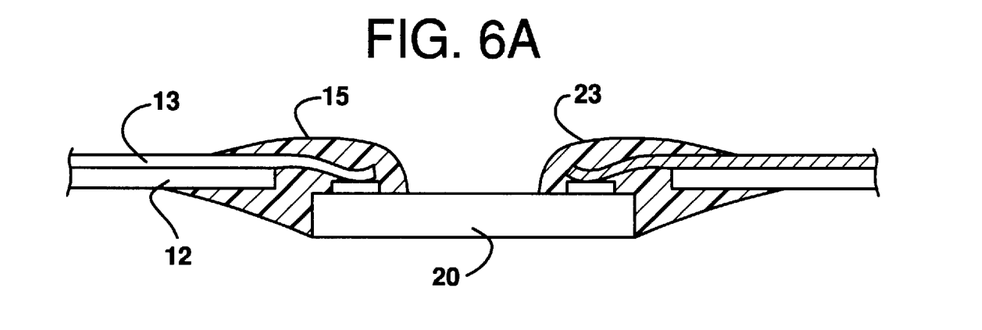
FIGS. 6A to 6C a sealing structure of the first embodiment of the present invention.
Figure 6B:
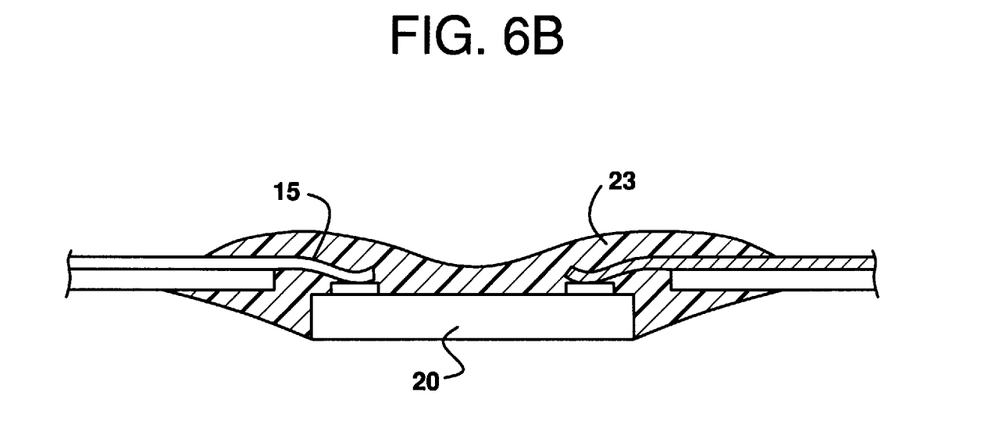
Figure 6C:
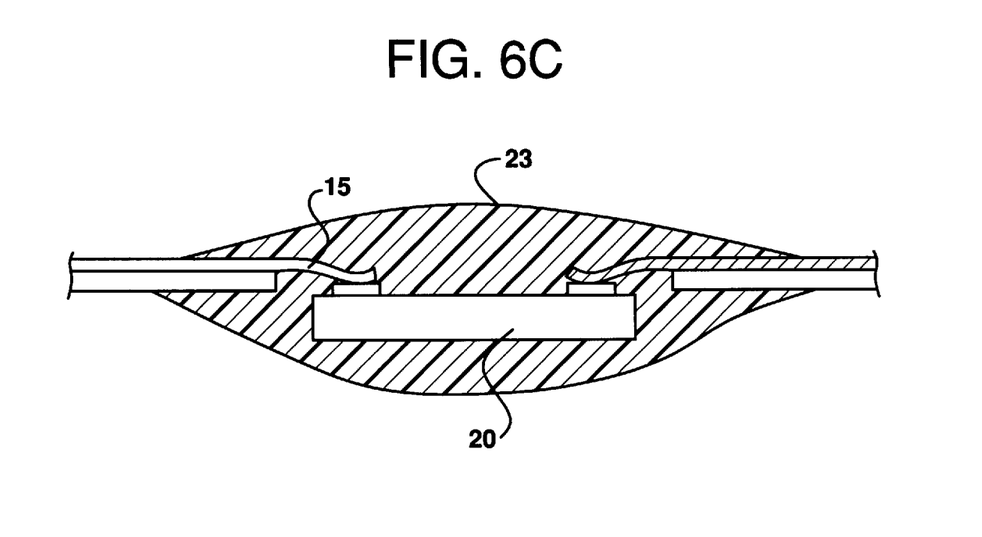

In order to enhance the reliability of the ILB structure and to protect an LSI circuit surface, in some cases, the LSI is sealed by an epoxy resin and a silicone resin. As shown in FIGS. 6(A) to 6(C), a resin sealing structure can be the sealing structure similar to the TAB. That is, the inner lead 15 portion of the conductive layer 13 is sealed by a resin 23 (see FIG. 6(A)). A surface side provided with the inner lead 15 and the bonding pad of the LSI 20 is sealed by the resin 23 (see FIG. 6(B)). The reins 23 seals all over the inner lead 15 and the LSI 20 (see FIG. 6(C)).

Furthermore, when the glass polyimide is used as an insulating material of the rigid portion 16, since the glass polyimide has a good heat resistance, the reliability can be enhanced.

Embodiment 2

Figure 7:
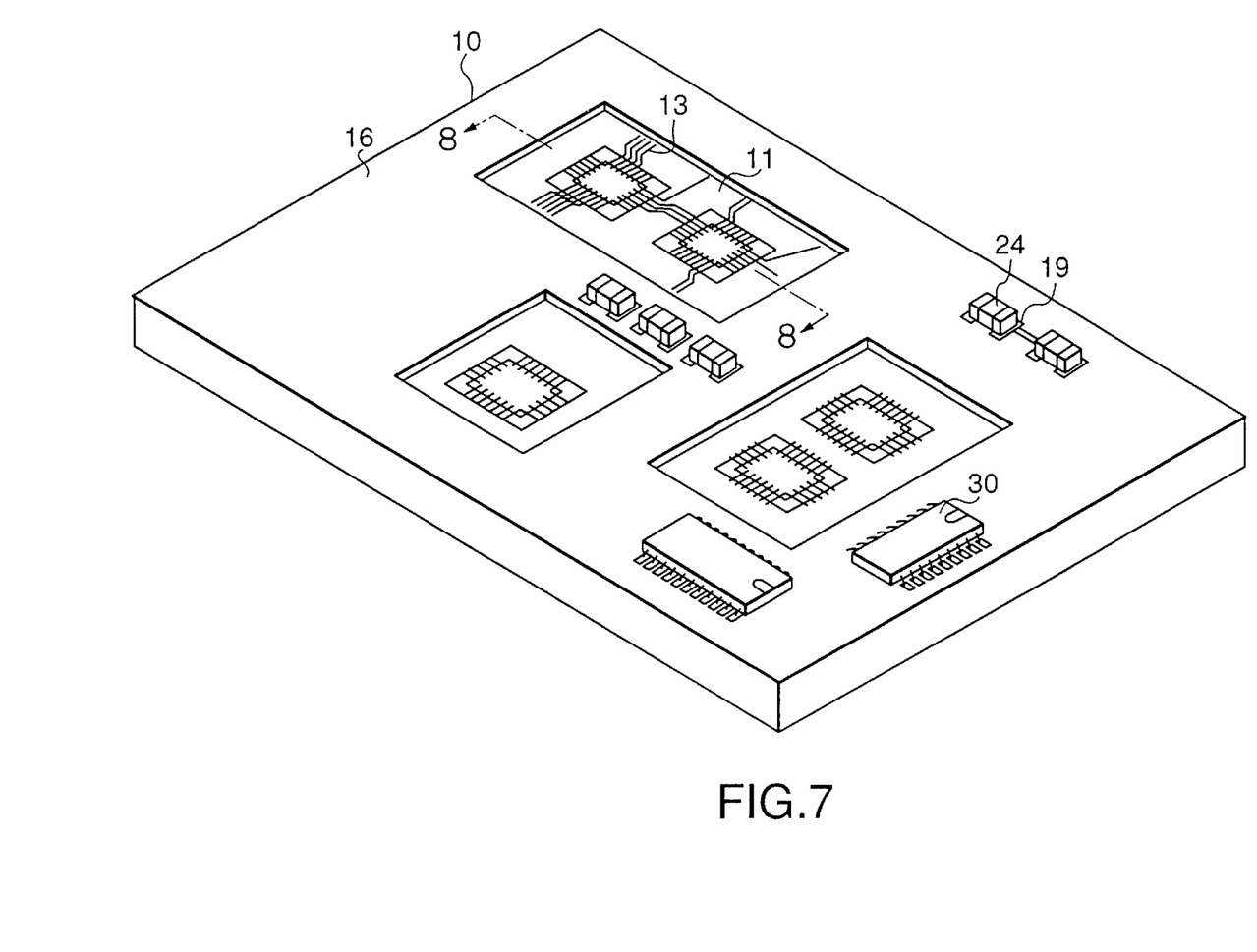
FIG. 7 shows a perspective view of a second embodiment of the present invention.
Figure 8:
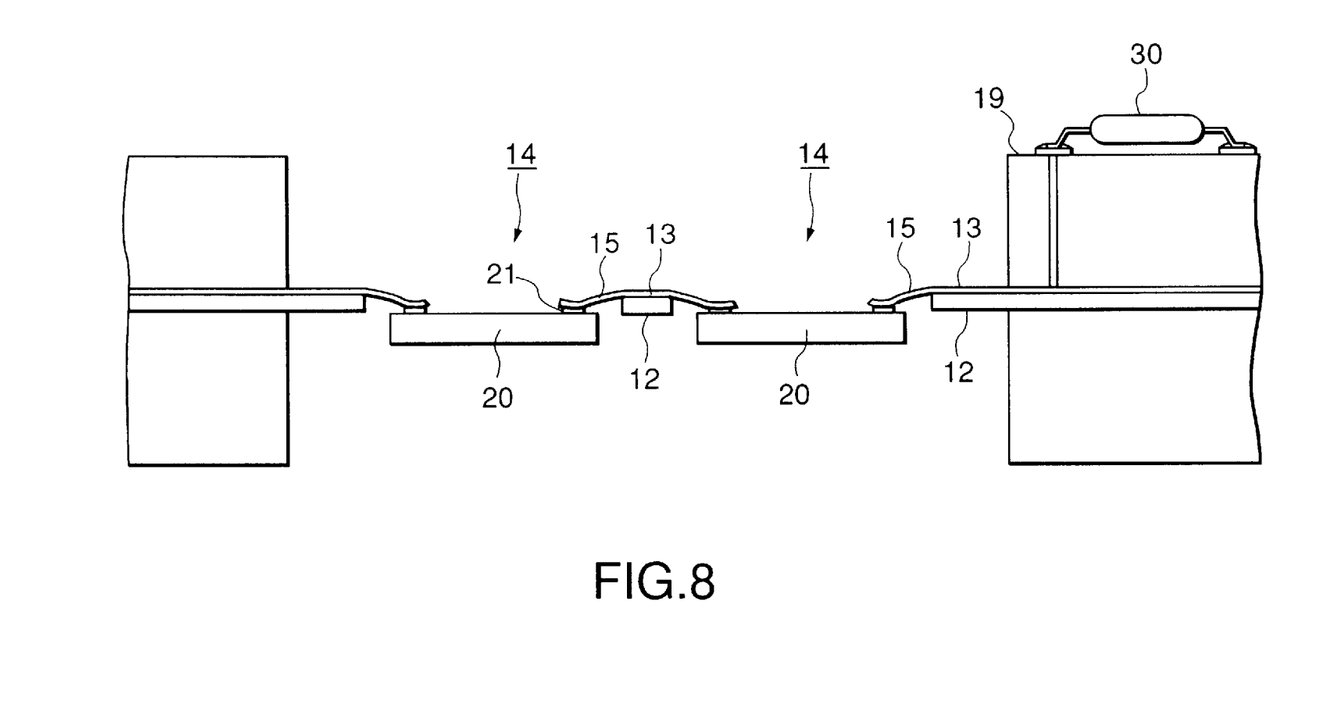
FIG. 8 shows a cross-sectional view taken on line 8—8 of FIG. 7.

Next, a second embodiment of the present invention will be described with reference to FIG. 7. FIG. 7 shows a perspective view of a second embodiment of the present invention. FIG. 8 shows a cross-sectional view taken on line 8—8 of FIG. 7.

As shown in FIG. 7, the mounting according to the second embodiment is characterized by that a plurality of LSIs are mounted. In such a manner, a plurality of LSI mounting portions are arranged to the flex portion 11 of one flex rigid substrate 10, and a plurality of LSIs are mounted on the substrate. Accordingly, a signal transmission distance between the LSIs can be shortened.

As shown in FIG. 8, according to the mounting structure of the second embodiment, the LSI 20 is directly fitted to the flexible (flex) portion 11 of the flex rigid substrate (the polyimide film and the conductive layer 13). Accordingly, the electrical distance between the LSIs is shortened, whereby such a great effect that the signal delay between the LSIs becomes smaller can be obtained. Furthermore, the rigid portion 16 has the multi-layer, whereby since the complex and high-density wiring can be realized, large scaling can be realized. As the combination of the LSIs, a plurality of operation processing portions (EPU) can be combined with one another and the EPU can be combined with the memory.

Furthermore, for example, only the EPU requiring the high speed processing is directly fitted to the flexible portion 11. The memory such as a mold package article 30 which is inexpensively available because of mass production is mounted to the rigid portion 16. In such a manner, performance and cost can be balanced with each other.

Embodiment 3

Next, a third embodiment of the present invention will be described with reference to FIG. 9.

When the semiconductor having a large heat release is used, a cooling structure is necessary.

Figure 9:
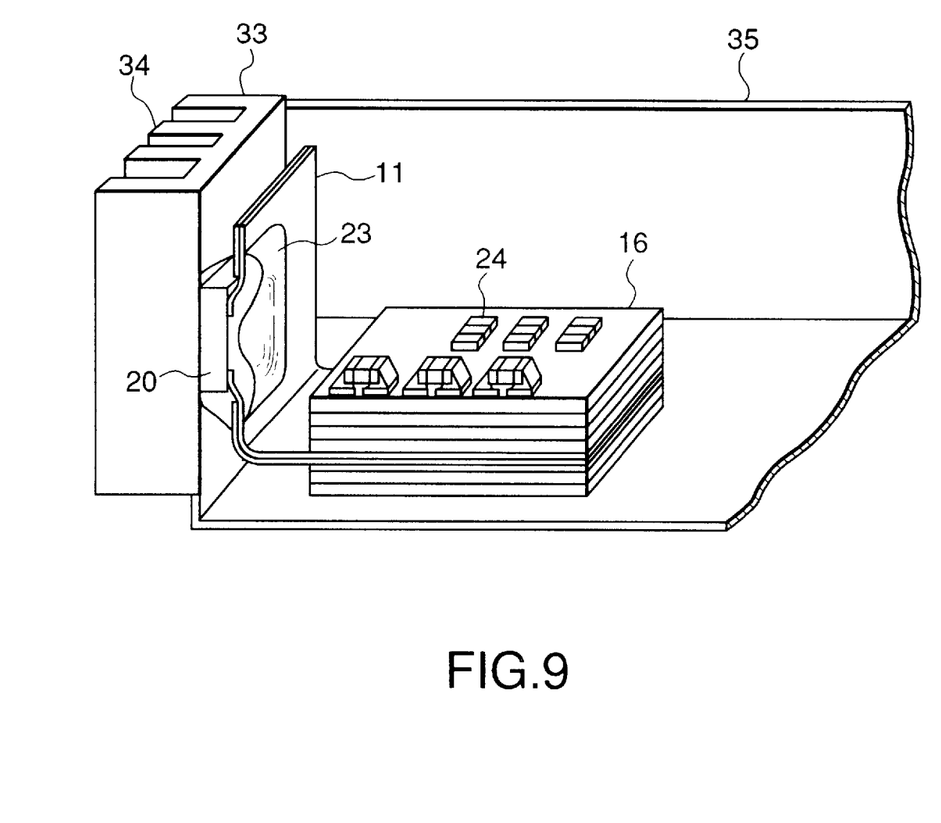
FIG. 9 shows a perspective view of a third embodiment of the present invention.

According to the third embodiment, as shown in FIG. 9, in order to increase a cooling efficiency, a heat sink 33 is arranged at a side surface of a box 35, and a heat dissipation fin 34 is arranged outside the box 35.

Furthermore, according to the third embodiment, the semiconductor integrated circuit (LSI) 20 is mounted to the flexible portion 11 having flexibility. While the LSI mounting portion is integrated with the substrate, the LSI mounting portion is flexed. The semiconductor integrated circuit 20 is contacted to the cooling structure 33 at the side surface of the box 35. Furthermore, the rigid portion 16 is arranged at a bottom surface of the box 35.

As described above, according to the present invention, in the chip carrier using the flex rigid PWB, since the LSI is directly connected and mounted to the substrate by using the connection terminal for the LSI arranged to the flex portion, there is less of the connection portion, whereby the reliability is enhanced. According to the present invention, the outer lead bonding is not necessary, and the number of the components and the manufacturing processes is reduced, whereby the cost is reduced.

Furthermore, according to the present invention, since the LSI is directly connected to the substrate, the wire length is shortened whereby the signal transmission delay time is reduced.

Furthermore, when the chip carrier is mounted to the substrate by using a soldering reflow, in case of the TCP, if the chip carrier becomes larger, there is such a problem that curvature is occurs. According to the present invention, the chip carrier has the rigidity for providing the rigid portion, whereby the problem is solved. Thus, it is possible to solder by using general reflow, and mass production is easy.

Furthermore, according to the present invention, since the chip carrier is provided with the rigid portion, there is such an advantage that the electronic component can be easily soldered and mounted to the chip carrier.

According to the present invention, since the chip carrier is flexed, a flexible layout can be realized. In case of the LSI having a high heat release, since an arrangement can be realized so that a cooling may be easily carried out, more specifically, a great effect can be obtained.

The advantage of the present invention over the ceramic MCM will be described below.

As the MCM in which a plurality of LSIs are mounted to one chip carrier, in general, the ceramic substrate is used as a material of the chip carrier. In case of the ceramic substrate, since the LSI is connected to the chip carrier, there are required two connections such as the connection of a bonding pad of the LSI and a bonding wire and the connection of the bonding wire and the electrode of the chip carrier. According to the chip carrier of the present invention, the chip carrier can be connected to the LSI by only connecting the bonding pad of the LSI to the inner lead by the ILB. Thus, the reliability is enhanced, and further the signal transmission time between the LSIs is reduced, which is suitable for high speed processing.

Furthermore, since the PWB is more inexpensive and lighter than the ceramic substrate, the small-sized light MCM having a higher performance can be inexpensively provided.

The advantage of the present invention over the TCP will be described below. Although the MCM and module using the TCP is small-sized and light, the multi-layer is difficult to realize.

According to the present invention, since the rigid portion of the chip carrier is multi-layered, the complex and high-density wiring can be realized. Thus, with the combination of the LSIs, there can be such various combinations that a plurality of EPUs are combined to one another and the EPU is combined to the memory, etc.

According to the present invention, the chip carrier has the rigid portion having rigidity. Accordingly, the receiving component such as the chip capacitor, the chip resistance, etc. or, in some cases, the packaged LSI (of the memory, etc.) can be easily mounted to the LSI.

What is claimed is:

1. A semiconductor mounting structure comprising a flex rigid substrate, wherein a flex portion is provided with a connection terminal for a semiconductor integrated circuit, the semiconductor integrated circuit being directly connected and mounted to said connection terminal for the semiconductor integrated circuit; and wherein the rigid portion of said flex rigid substrate is provided with an external input/output terminal, and the semiconductor integrated circuit is connected and mounted to the mounting substrate by using said external input/output terminal.

2. A semiconductor mounting structure comprising a flex rigid substrate, wherein a flex portion is provided with a connection terminal for a semiconductor integrated circuit, the semiconductor integrated circuit being directly connected and mounted to said connection terminal for the semiconductor integrated circuit;

wherein said semiconductor integrated circuit is sealed by a resin after mounting said semiconductor integrated circuit; and wherein a rigid portion of said flex rigid substrate is provided with an electrode for mounting an electronic component, and the electronic component is mounted to said connection terminal for mounting the electronic component.

3. A semiconductor mounting structure comprising a flex rigid substrate, wherein a flex portion is provided with a connection terminal for a semiconductor integrated circuit, the semiconductor integrated circuit being directly connected and mounted to said connection terminal for the semiconductor integrated circuit;

wherein a rigid portion of said flex rigid substrate is provided with an electrode for mounting an electronic component, and the electronic component is mounted to said connection terminal for mounting the electronic component; and wherein the rigid portion of said flex rigid substrate is provided with an external input/output terminal, and the semiconductor integrated circuit is connected and mounted to the mounting substrate by using said external input/output terminal.

4. A semiconductor mounting structure comprising a flex rigid substrate, wherein a flex portion is provided with a connection terminal for a semiconductor integrated circuit, the semiconductor integrated circuit being directly connected and mounted to said connection terminal for the semiconductor integrated circuit;

wherein a plurality of semiconductor integrated circuits are mounted to said flex portion; and wherein the rigid portion of said flex rigid substrate is provided with an external input/output terminal, and the semiconductor integrated circuit is connected and mounted to the mounting substrate by using said external input/output terminal.

5. A semiconductor mounting structure comprising a flex rigid substrate, wherein a flex portion is provided with a connection terminal for a semiconductor integrated circuit, the semiconductor integrated circuit being directly connected and mounted to said connection terminal for the semiconductor integrated circuit;

wherein said semiconductor integrated circuit is sealed by a resin after mounting said semiconductor integrated circuit;

wherein a plurality of semiconductor integrated circuits are mounted to said flex portion; and wherein the rigid portion of said flex rigid substrate is provided with an external input/output terminal, and the semiconductor integrated circuit is connected and mounted to the mounting substrate by using said external input/output terminal.

6. The semiconductor mounting structure according to claim 4, wherein a mounting portion of the semiconductor integrated circuit of said flex portion is arranged so that the mounting portion being integrated with the substrate can be adjacent to a cooling means, said semiconductor integrated circuit is adjacent or contacted to said cooling means.

7. The semiconductor mounting structure according to claim 5, wherein a mounting portion of the semiconductor integrated circuit of said flex portion is arranged so that the mounting portion being integrated with the substrate can be adjacent to a cooling means, said semiconductor integrated circuit is adjacent or contacted to said cooling means.

* * * * *